(12) United States Patent
Costello

(10) Patent No.: US 7,887,361 B2
(45) Date of Patent: Feb. 15, 2011

(54) FIXTURE FOR INSTALLING A GUIDE PIN

(75) Inventor: Brian Patrick Costello, Scotts Valley, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/182,819

(22) Filed: Jul. 30, 2008

(65) Prior Publication Data

US 2010/0029103 A1 Feb. 4, 2010

(51) Int. Cl.
*H01R 13/64* (2006.01)
(52) U.S. Cl. ...................................... 439/378
(58) Field of Classification Search ................ 439/681, 439/680, 378, 359, 59; 361/804; 29/453
See application file for complete search history.

(56) References Cited

U.S. PATENT DOCUMENTS

| 3,836,704 | A | * | 9/1974 | Coules | 174/138 D |
| 5,391,091 | A | * | 2/1995 | Nations | 439/378 |
| 5,754,412 | A | * | 5/1998 | Clavin | 361/804 |
| 6,945,810 | B1 | | 9/2005 | Morana et al. | |
| 6,997,736 | B2 | | 2/2006 | Costello et al. | |
| 7,186,121 | B1 | | 3/2007 | Costello et al. | |
| 7,326,092 | B2 | | 2/2008 | Fedder et al. | |

* cited by examiner

*Primary Examiner*—Alexander Gilman

(57) ABSTRACT

A fixture is provided for installing a guide pin to a substrate. The fixture includes an elongate body extending a length along a longitudinal axis between a mounting end portion and a receiving end portion. The mounting end portion is configured to be mounted on a support member. An opening extends into the body through the receiving end portion of the body and along the longitudinal axis. The opening is configured to receive at least a portion of the guide pin therein.

20 Claims, 8 Drawing Sheets

FIXTURE FOR INSTALLING A GUIDE PIN

BACKGROUND OF THE INVENTION

The subject matter described and/or illustrated herein relates generally to guide pins, and more particularly, to a fixture for installing guide pins to a substrate.

Some known computer systems, such as rack and panel computer systems, include a primary circuit board that is electrically connected to one or more peripheral circuit boards. The primary circuit board is commonly referred to as a backplane and the peripheral circuit boards are commonly referred to as daughter cards. Typically, one or more guide pins are used to mechanically link the backplane with the daughter card(s). The guide pins may provide preliminary alignment and/or preliminary guidance between the backplane and the daughter card(s) to facilitate mating electrical connectors of the backplane and the daughter card(s). The guide pins may also provide load carrying capability between the backplane and the daughter card(s) as well as keying and electrostatic discharge (ESD) protection.

Guide pins are commonly installed individually within the backplane and/or the daughter cards one at a time. For example, a mounting end portion of each guide pin is individually aligned with and inserted into a corresponding through hole of the backplane or daughter card on a first side thereof. A fastener, such as a threaded fastener, is then connected to the mounting end portion of the guide pin on a second side of the backplane or daughter card to hold the mounting end portion of the guide pin within the through hole. However, individually installing each guide pin one at a time may be more difficult and/or time consuming than is desired, which may cause installing guide pins to be more expensive than desired.

To avoid the time and/or difficulty of individually installing guide pins one at a time, fixture plates have been proposed for use in simultaneously installing a plurality of guide pins. For example, a fixture plate may include a plurality of holes for holding the guiding portions of the plurality of guide pins such that the mounting end portions are exposed for insertion into the holes within the backplane or daughter card. However, the pattern of holes within the fixture plate must match the pattern of holes of the particular backplane or daughter card to which the guide pins are being installed. Accordingly, known fixture plates may be more expensive than is desired because a different fixture plate having the matching pattern of holes must be fabricated for each backplane and/or daughter card having a different pattern of holes.

A need remains for a less expensive fixture for simultaneously installing a plurality of guide pins to a substrate.

BRIEF DESCRIPTION OF THE INVENTION

In one embodiment, a fixture is provided for installing a guide pin to a substrate. The fixture includes an elongate body extending a length along a longitudinal axis between a mounting end portion and a receiving end portion. The mounting end portion is configured to be mounted on a support member. An opening extends into the body through the receiving end portion of the body and along the longitudinal axis. The opening is configured to receive at least a portion of the guide pin therein.

The opening optionally includes a size and a shape that is complementary with a size and a shape of a guide portion of the guide pin. Optionally, the opening extends a depth into the body that is at least as long as a length of the guide portion of the guide pin. The opening optionally extends completely through the body from the receiving end portion and through the mounting end portion. In some embodiments, the mounting end portion includes a mounting extension that is configured to be at least partially received within a mounting hole of the support member.

The receiving end portion may include an end surface through which the opening extends. Optionally, the end surface includes a recess having a size and a shape that is approximately complementary with a size and a shape of a collar of the guide pin. The mounting end portion of the body optionally includes an alignment extension configured to orient the body relative to the support member.

In another embodiment, a fixture assembly is provided. The fixture assembly includes a support member having a mounting surface, and at least one fixture mounted on the support member for installing at least one guide pin to a substrate. The fixture includes an elongate body extending a length along a longitudinal axis between a mounting end portion and a receiving end portion. The mounting end portion is mounted on the support member such that the body extends outwardly from the mounting surface of the support member. An opening extends into the body through the receiving end of the body and along the longitudinal axis. The opening is configured to receive at least a portion of the guide pin therein.

DETAILED DESCRIPTION OF THE INVENTION

Figure 1:
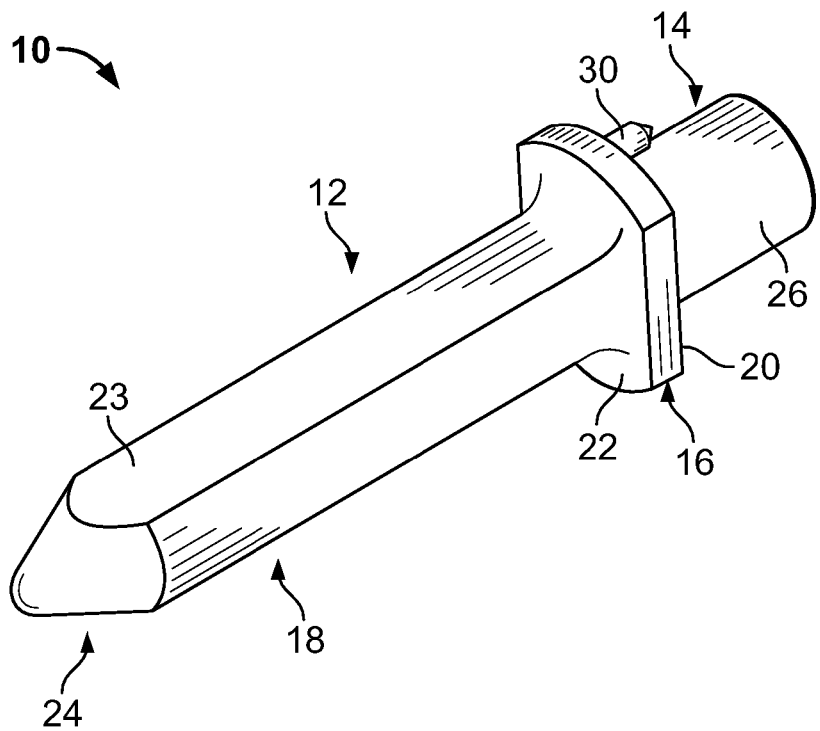
FIG. 1 is a perspective view of an exemplary embodiment of a guide pin.
Figure 2:
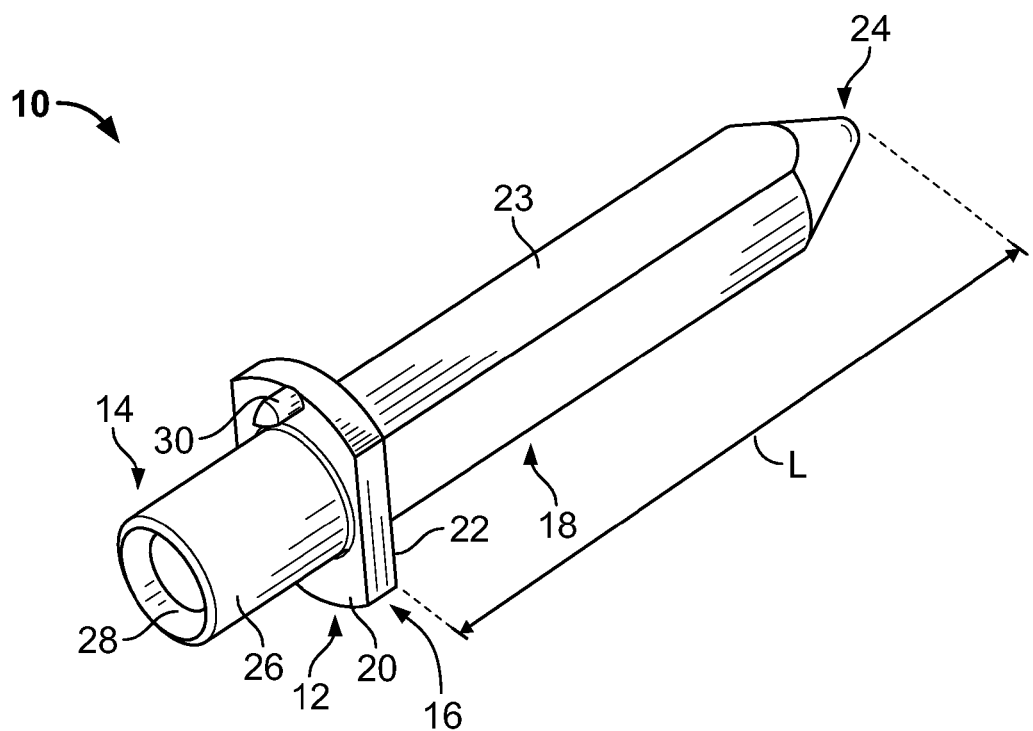
FIG. 2 is another perspective view of the guide pin shown in FIG. 1.

FIGS. 1 and 2 are perspective views of an exemplary embodiment of a guide pin 10. The guide pin 10 includes a body 12 having a mounting portion 14, a collar 16, and a guide portion 18. The mounting portion 14 and the guide portion 18 extend outwardly from opposite surfaces 20 and 22, respectively, of the collar 16. The guide portion 18 extends a length L outwardly from the collar 16 to a tip portion 24. In the exemplary embodiment, the guide portion 18 includes a pair of flats 23 that function as keying elements and surfaces that prevent rotation of the guide pin 10.

The mounting portion 14 is configured to be installed to a substrate (such as, but not limited to, the backplane 25 shown in FIGS. 9-13). In the exemplary embodiment, the mounting portion 14 includes a mounting extension 26 that extends outwardly from the collar surface 20. The mounting extension 26 is configured to be received within a hole (such as, but not limited to, the hole 27 shown in FIG. 9) of the backplane 25. As will be described below, in the exemplary embodiment, the mounting portion 14 of the body 12 includes a threaded opening 28 for receiving a threaded fastener (such as, but not limited to, the threaded faster 29 shown in FIG. 12) for securing the body 12 to the substrate. An alignment extension 30 extends outwardly from the collar surface 20 along the mounting portion 14 for orienting the guide pin body 12 relative to the substrate.

Figure 3:
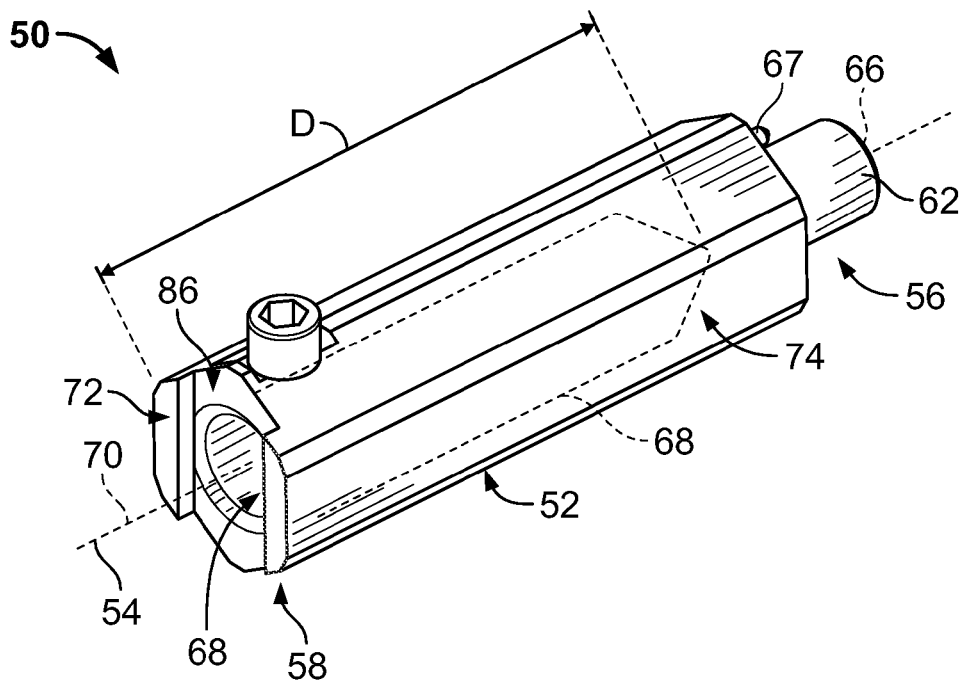
FIG. 3 is a perspective view of an exemplary embodiment of a fixture for installing a guide pin to a substrate.
Figure 4:
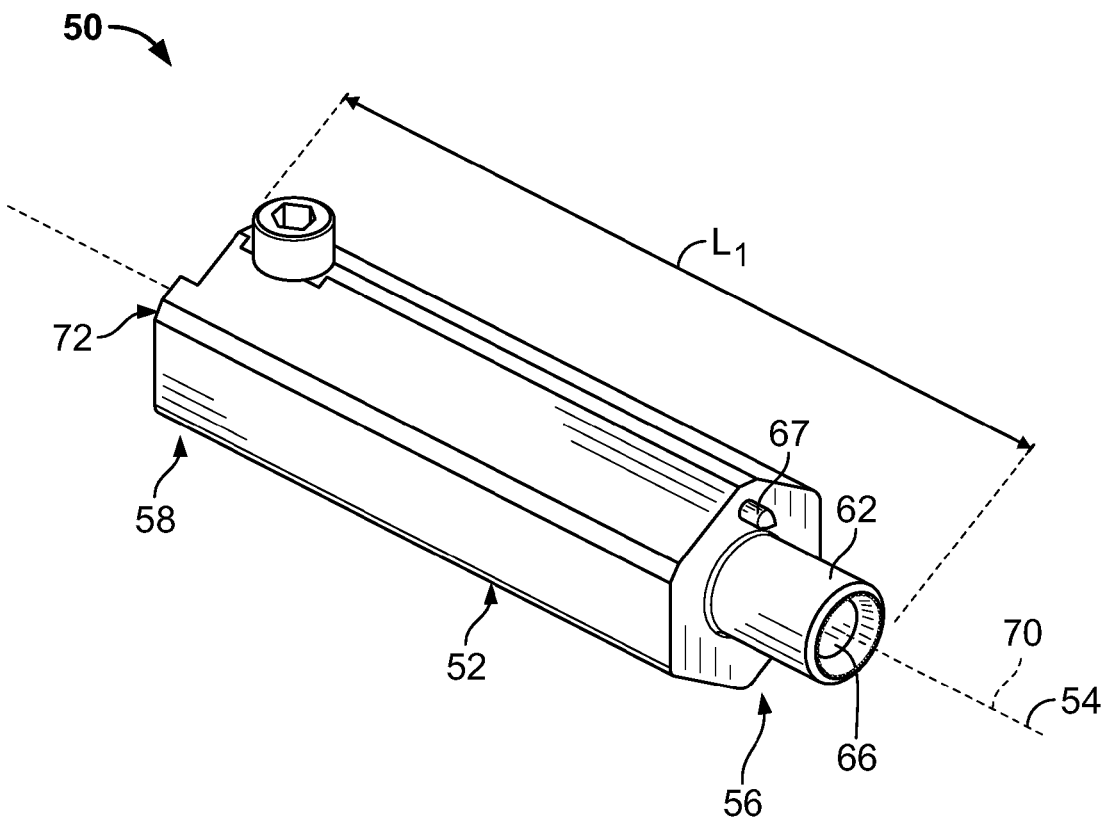
FIG. 4 is another perspective view of the fixture shown in FIG. 3.

FIGS. 3 and 4 are perspective views of an exemplary embodiment of a fixture 50 for installing a guide pin (such as, but not limited to, the guide pin 10 shown in FIGS. 1, 2, 5, 6, 8, and 10-13) to a substrate (such as, but not limited to, the backplane 25 shown in FIGS. 9-13). The fixture 50 includes an elongate body 52 that extends a length $L_1$ along a central longitudinal axis 54 between a mounting end portion 56 and a receiving end portion 58.

The mounting end portion 56 is configured to be mounted on a support member 60 (FIGS. 7, 8, and 10-12). In the exemplary embodiment, the mounting end portion 56 includes a mounting extension 62 that is configured to be received within a hole 64 (FIG. 7) of the support member 60. Moreover, the mounting extension 62 includes a threaded opening 66 for receiving a threaded fastener (such as, but not limited to, the threaded fastener 29 shown in FIG. 12) for securing the body 52 to the support member 60. The mounting end portion 56 may optionally include an alignment extension 67 for orienting the fixture body 52 relative to the support member 60.

In addition or alternative to what is listed above in this paragraph, the mounting end portion 56 may include any other suitable configuration, arrangement, method, structure, means, and/or the like for mounting the fixture 50 on the support member 60, such as, but not limited to, a press-fit arrangement, a surface mount arrangement, a threaded stud, and/or the like.

The fixture 50 includes an opening 68 extending into the body 52 for at least partially receiving the guide portion 18 (FIGS. 1, 2, 5, 6, 8, and 13) of the guide pin 10 therein. In the exemplary embodiment, the opening 68 extends into the body through the receiving end portion 58 and along the central longitudinal axis 54 such that a central longitudinal axis 70 of the opening 68 is aligned with the central longitudinal axis 54 of the body 52. Specifically, the opening 68 extends through an end surface 72 of receiving end portion 58 of the body 52. In the exemplary embodiment, and as best seen in FIG. 3, the opening 68 extends a depth D into the body 52 to a bottom portion 74.

Figure 5:
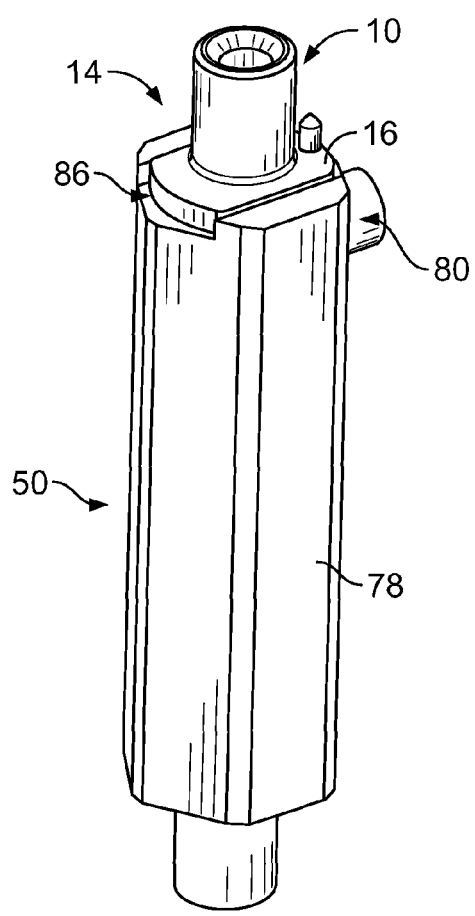
FIG. 5 is a perspective view of the fixture shown in FIGS. 3 and 4 supporting the guide pin shown in FIGS. 1 and 2.
Figure 6:
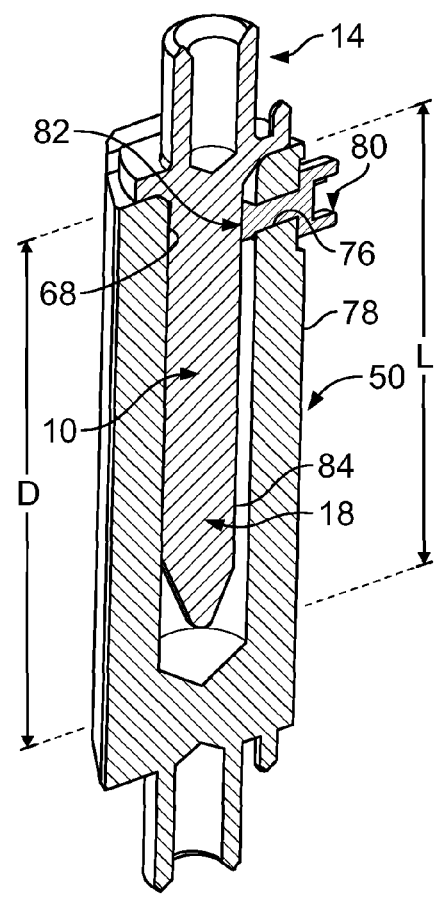
FIG. 6 is cross-sectional view of the fixture shown in FIGS. 3 and 4 supporting the guide pin shown in FIGS. 1 and 2.

FIGS. 5 and 6 are perspective and cross-sectional views, respectively, illustrating the fixture 50 supporting the guide pin 10. As best seen in FIG. 6, the fixture 50 holds the guide portion 18 of the guide pin 10 such that the mounting portion 14 of the guide pin 10 is exposed for installation to the backplane 25 (FIGS. 9-13). Specifically, the opening 68 at least partially receives the guide portion 18 of the guide pin 10 therein. In the exemplary embodiment, the depth D of the opening 68 is longer than length L of the guide portion 18 of the guide pin 10. Accordingly, the entirety of the length L of the guide portion 18 is held within the opening 68. Alternatively, the depth D of the opening 68 is the approximately equal to the length L of the guide portion 18 of the guide pin 10, or the depth D of the opening 68 is shorter than the length L of the guide portion 18 such that only a portion of the length L of the guide portion 18 is received within the opening 68.

The opening 68 may have any size (including the depth D), shape, geometry, and/or the like for at least partially receiving any size, shape, geometry, and/or the like of a guide portion of a guide pin and/or that enables the fixture 50 to function as described and/or illustrated herein. In some embodiments, the opening 68 has a size (including the depth D), shape, geometry, and/or the like that is approximately complementary with the size, shape, geometry, and/or the like of the guide portion of the guide pin being supported by the fixture 50. In the exemplary embodiment, the opening 68 has a shape that is approximately cylindrical and the size of the approximate cylinder is such that the opening 68 is shaped approximately complementary with curved surfaces of the guide portion 18. However, the shape of the opening 68 does not include any flat portions that correspond to the flats 23 (FIGS. 1 and 2) of the guide portion 18 such that the opening 68 is not shaped approximately complementary with the flats 23.

The fixture 50 includes an optional opening 76 that extends through an exterior surface 78 of the body 52 and into communication with the opening 68. In the exemplary embodiment, the opening 76 is threaded such that the opening 76 can receive a set screw 80 therein. The set screw 80 can be threaded into the opening 76 such that a tip portion 82 of the set screw 80 engages an exterior surface 84 of the guide portion 18. The engagement between the tip portion 82 of the set screw 80 and the exterior surface 84 of the guide portion may facilitate securing the guide pin 10 to the fixture 50 and/or may facilitate preventing rotation of the guide pin 10 within the opening 68 to preserve an orientation of the guide pin 10 relative to the back plane 25 during installation.

Referring now to FIGS. 3 and 5, the end surface 72 of the body 52 includes an optional recess 86. At least a portion of the size, shape, geometry, and/or the like of the recess 86 is approximately complementary with at least a portion of the size, shape, geometry, and/or the like of the collar 16 of the guide pin 10. When the guide portion 18 of the guide pin 10 is received within the opening 68, the collar 16 is at least partially received within the recess 86. The approximately complementary shape between at least portions of the recess 86 and the collar 16 may facilitate orienting the guide pin 10 relative to the back plane 25 during installation and/or may facilitate preventing rotation of the guide pin 10 within the opening 68 to preserve the orientation of the guide pin 10 relative to the back plane 25 during installation.

Figure 7:
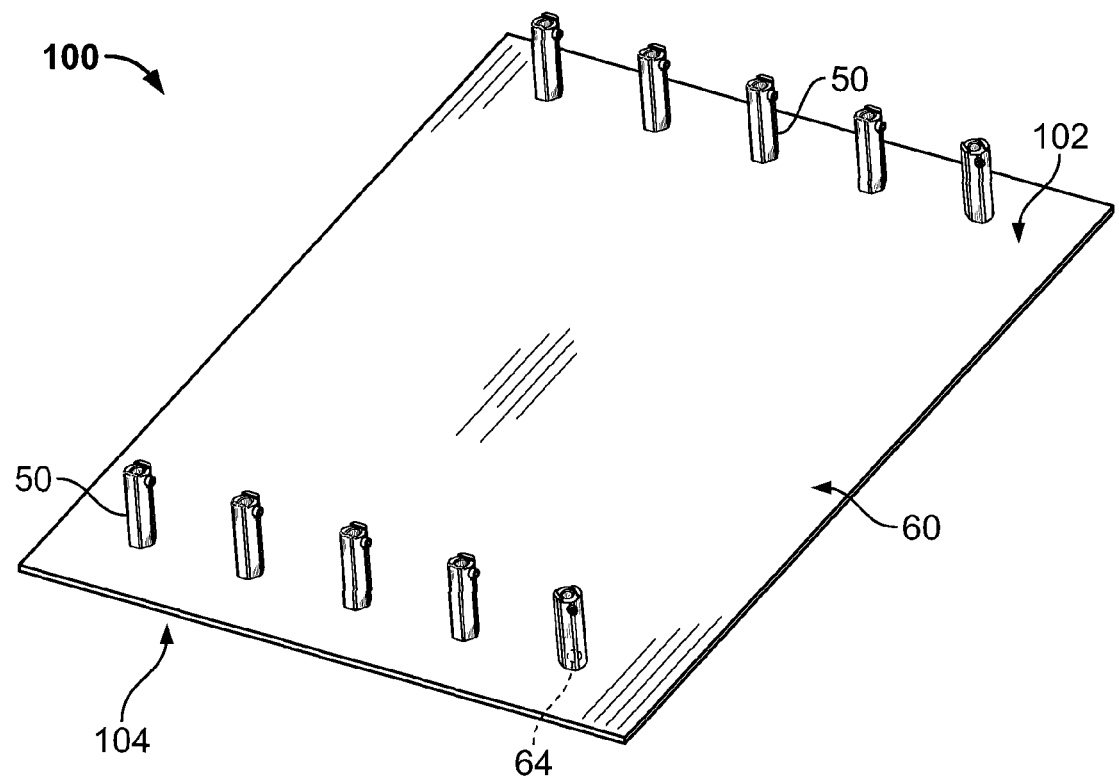
FIG. 7 is a perspective view of an exemplary embodiment of a fixture assembly.

FIG. 7 is a perspective view of an exemplary embodiment of a fixture assembly 100 for simultaneously installing a plurality of guide pins (such as, but not limited to, the guide pin 10 shown in FIGS. 1, 2, 5, 6, 8, and 10-13) to a substrate (such as, but not limited to the back plane 25 shown in FIGS. 9-14). The fixture assembly 100 includes the support member 60 and a plurality of the fixtures 50 mounted on the support member 60. Specifically, the mounting extension 62 (FIGS. 3 and 4) of each fixture 50 is received within a corresponding one of the holes 64 within the support member 60 such that each fixture 50 extends outwardly from the support member 60 along a side portion 102 thereof. The side portion 102 may be referred to herein as a "mounting surface". A threaded fastener (such as, but not limited to, the threaded fastener 29 shown in FIG. 12) is optionally threaded into the threaded opening 66 (FIGS. 3 and 4) of each fixture 50 from a side portion 104 of the support member 60 opposite the side portion 102 to secure the fixture 50 to the support member 60. The alignment extension 67 of each fixture 50 is received within a corresponding hole (not shown) within the support member 60 such that the fixture 50 has a predetermined orientation relative to the support member 60 (and therefore such that the guide pin has a predetermined orientation relative to the back plane 25).

The pattern of holes 64 within the support member 60 may be selected to match the intended pattern of the guide pins 10 on the back plane 25. Despite the rectangular plate shown in the exemplary embodiment, the support member 60 may have any other suitable size, shape, geometry, and/or the like that enables the support member 60 to function as described herein.

Figure 8:
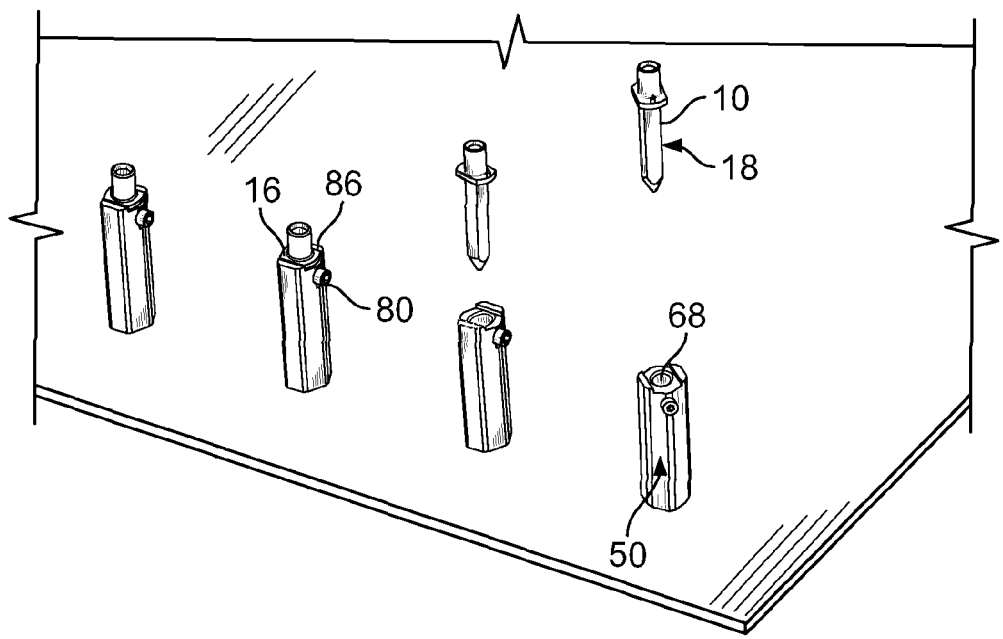
FIG. 8 is a perspective view of a portion of the fixture assembly shown in FIG. 7.

As shown in FIG. 8, to install a plurality of the guide pins 10 to the back plane 25 (FIGS. 9-13), the guide portion 18 of each guide pin 10 is inserted into the opening 68 of a corresponding one of the fixtures 50 such that the guide pin 10 is held by the fixture 50 as shown. The collar 16 of each guide pin 10 is received within the recess 86 of the corresponding fixture 50 to facilitate holding the guide pins 10 in the predetermined orientations relative to the back plane 25. The set screws 80 may be tightened to secure the guide pins 10 to the fixtures 50. Once the guide pins 10 are supported by the fixtures 50 as shown in FIG. 8, the guide pins 10 are ready to be installed to the back plane 25.

Figure 9:
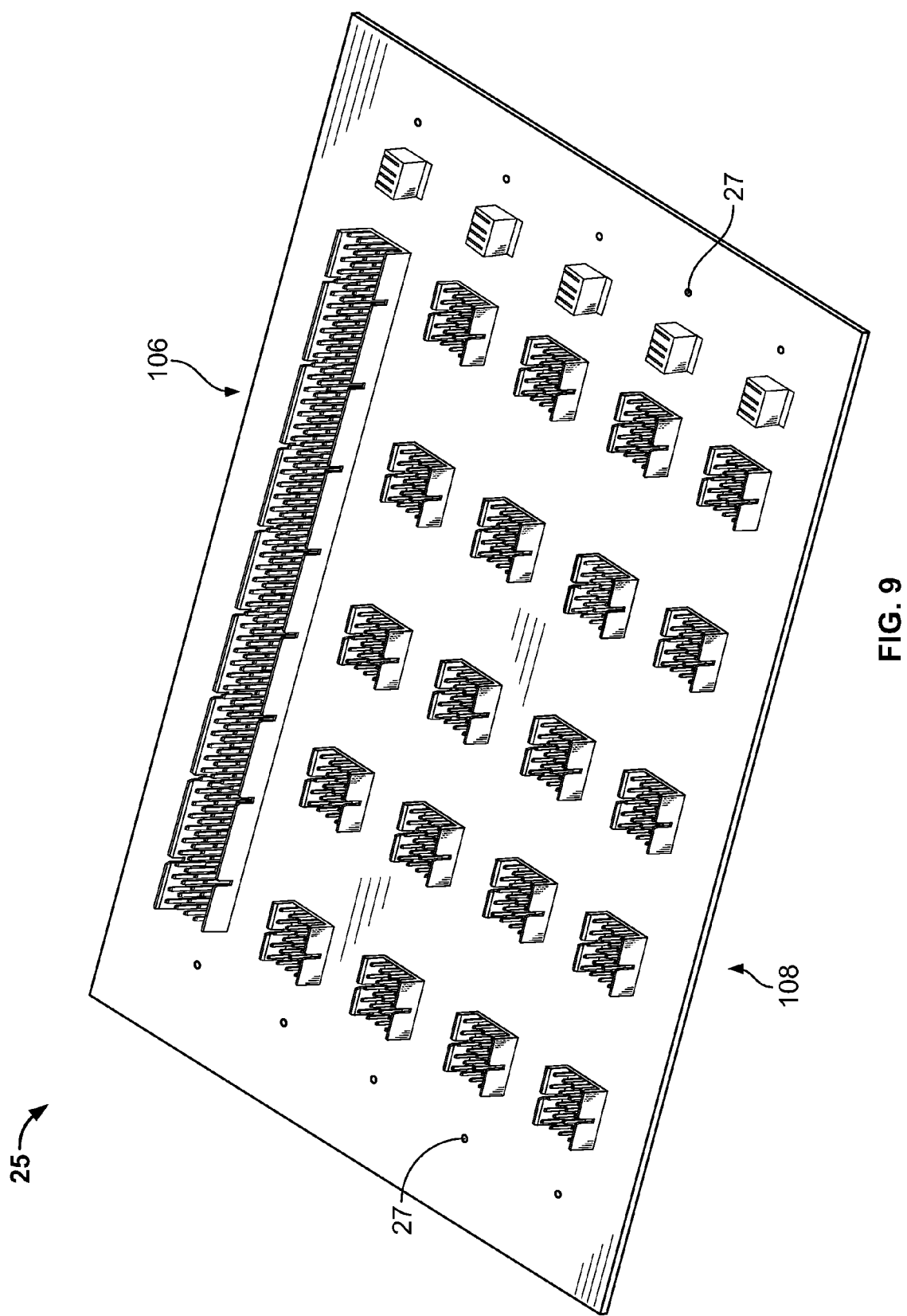
FIG. 9 is a perspective view of an exemplary embodiment of a back plane to which the guide pin shown in FIGS. 1 and 2 may be installed.

FIG. 9 is a perspective view of an exemplary embodiment of the back plane 25. The back plane includes a pair of opposite side portions 106 and 108 and a pattern of a plurality of the holes 27. The pattern of holes 27 within the back plane may match the pattern of holes 64 within the support member 60. Despite the rectangular plate shown in the exemplary embodiment, the back plane 25 may have any other suitable size, shape, geometry, and/or the like that enables the back plane 25 to function as described herein.

Figure 10:
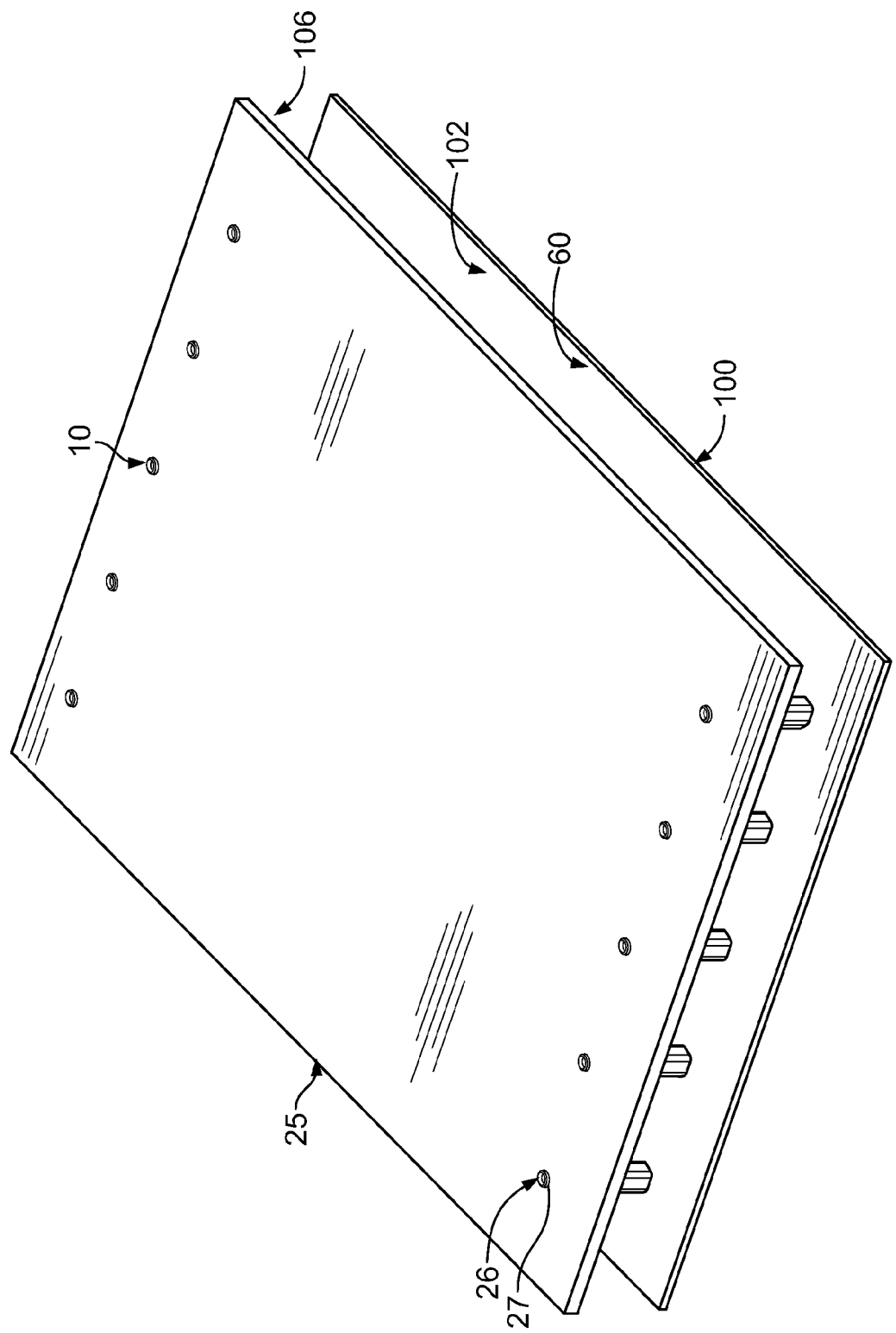
FIGS. 10-12 are perspective views illustrating installation of a plurality of the guide pins shown in FIGS. 1 and 2 to the back plane shown in FIG. 9 using the fixture assembly shown in FIG. 7.
Figure 11:
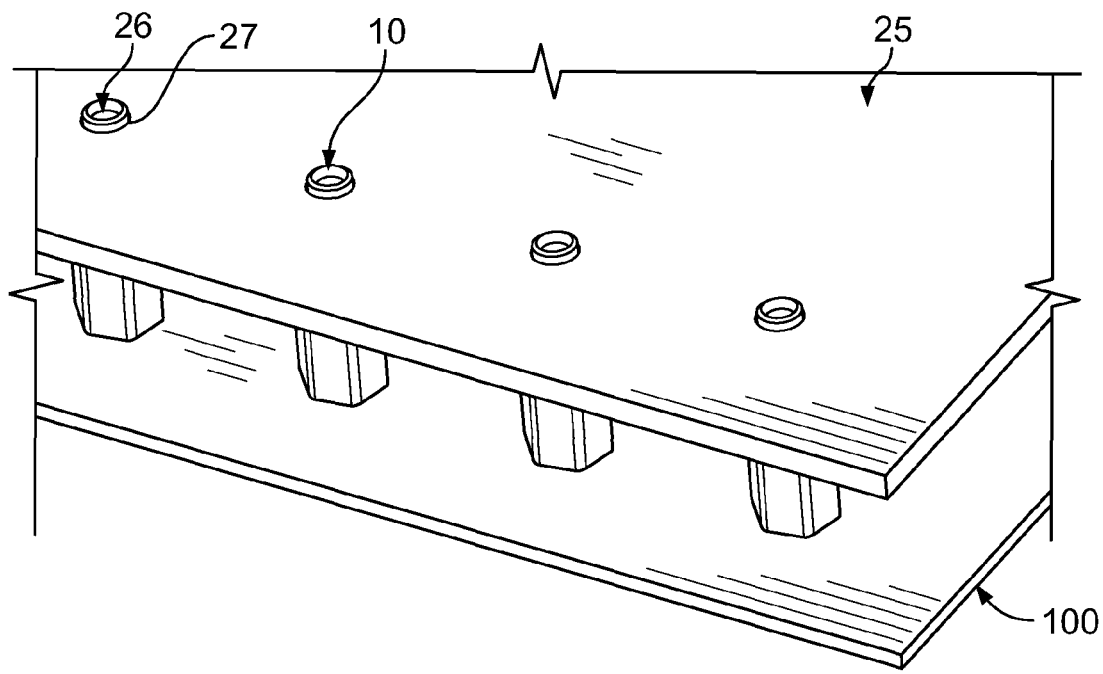

Referring now to FIG. 10, the back plane 25 is brought over the fixture assembly 100 such that the side portion 106 of the back plane 25 faces the side portion 102 of the support member 60. The back plane 25 is then moved toward the support member 60 such that the mounting extension 26 of each guide pin 10 is received within the corresponding opening 27 within the back plane 25, as is best seen in FIG. 11. The alignment extension 30 (FIGS. 1 and 2) of each guide pin 10 is received within a corresponding hole (not shown) within the back plane 25 such that the guide pin 10 has the predetermined orientation relative to the back plane 25).

Figure 12:
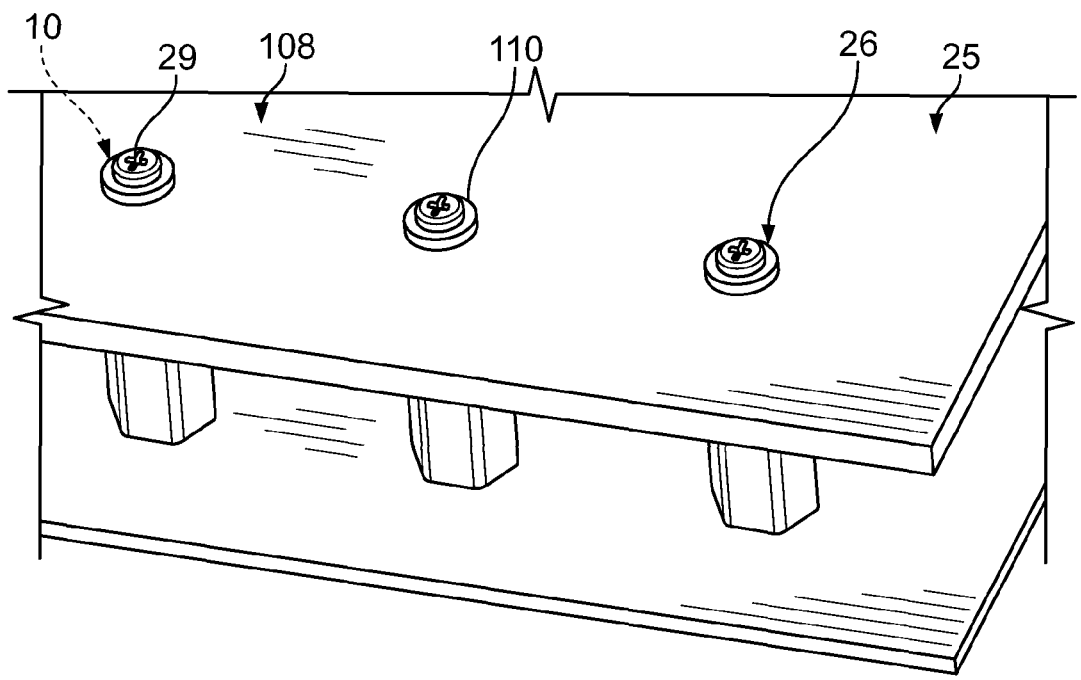
Figure 13:
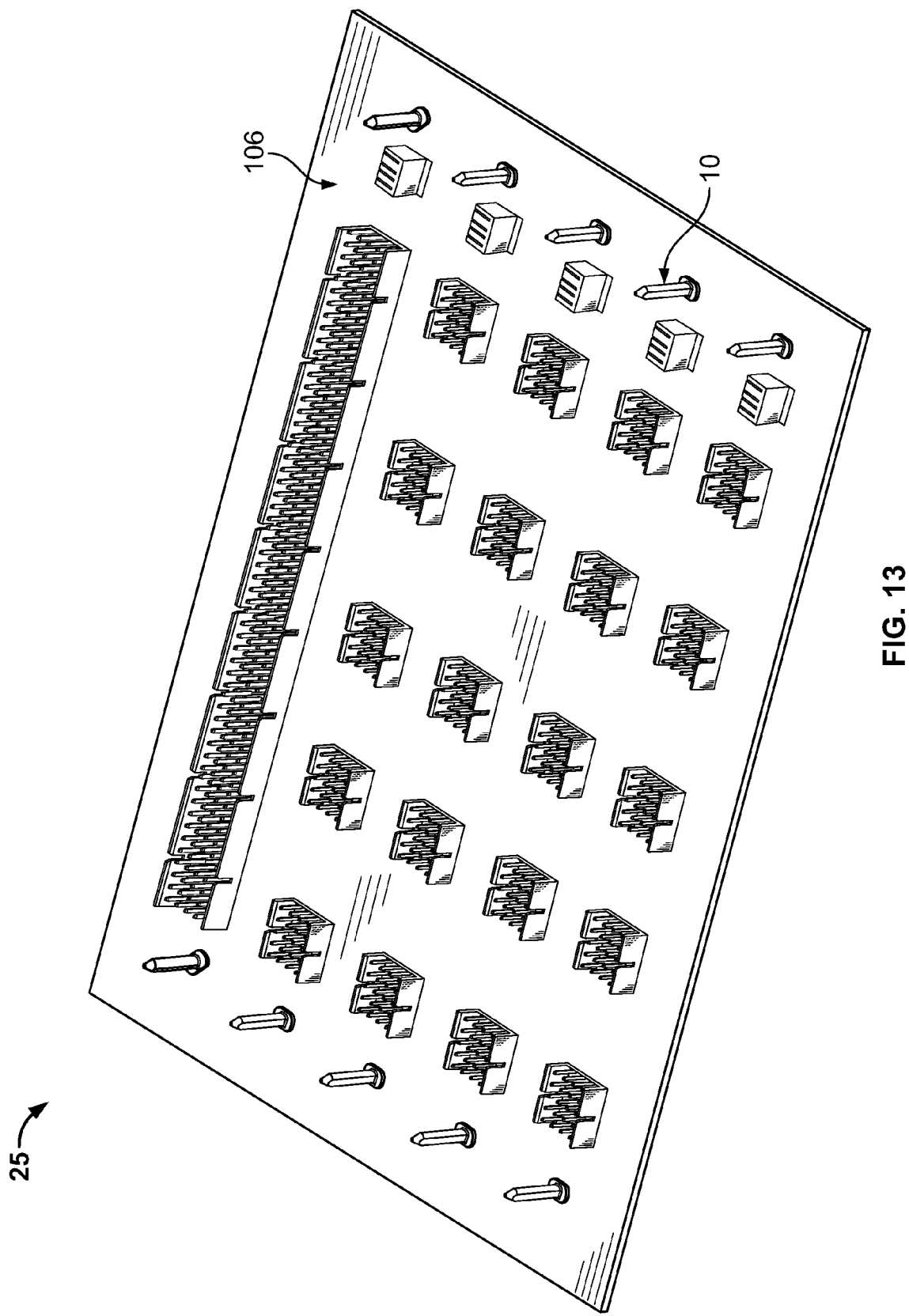
FIG. 13 is a perspective view of the back plane shown in FIG. 9 having a plurality of the guide pins shown in FIGS. 1 and 2 installed thereto.

As shown in FIG. 12, the threaded fasteners 29 are threaded into the threaded opening 28 (FIGS. 1 and 2) of each of the guide pins 10 from the side portion 108 of the back plane 25 to secure the guide pin 10 to the back plane 25. Optionally, a washer 110 is used with the threaded fastener 29. The set screws 80 of the fixtures 50 may then be loosened and the back plane 25 may be removed from the fixture assembly 100 such that the guide portions 18 of the guide pins 10 are removed from the openings 68 of the fixtures 50. FIG. 13 illustrates the back plane 25 having a plurality of the guide pins 10 installed thereon such that the guide pins 10 extend outwardly along the side portion 106.

The embodiments described and/or illustrated herein may provide a less expensive fixture assembly that is capable of simultaneously installing a plurality of guide pins to a substrate. For example, because the pattern of holes 27 within the back plane may match the pattern of holes 64 within the support member 60, a sample and/or test board may be used as the support member 60, which may reduce a cost of the fixture assembly 100.

The guide pin 10 shown herein is meant as exemplary only. The size, shape, geometry, and/or the like of the guide pin 10 overall and/or of the mounting portion 14, the collar 16, the guide portion 18, and/or any other component, portion, and/or the like of the guide pin 10 is/are not limiting. Rather, the fixture and fixture assembly embodiments described and/or illustrated herein may be practiced with any other size, shape, geometry, and/or the like of the guide pin 10 overall and/or of the mounting portion 14, the collar 16, the guide portion 18, and/or any other component, portion, and/or the like of the guide pin 10. For example, the mounting portion 14 may include any other suitable configuration, arrangement, method, structure, means, and/or the like of for installing the guide pin 10 to the substrate, such as, but not limited to, a press-fit arrangement, a surface mount arrangement, and/or the like.

Exemplary embodiments are described and/or illustrated herein in detail. The embodiments are not limited to the specific embodiments described herein, but rather, components and/or steps of each embodiment may be utilized independently and separately from other components and/or steps described herein. Each component, and/or each step of one embodiment, can also be used in combination with other components and/or steps of other embodiments. When introducing elements/components/etc. described and/or illustrated herein, the articles "a", "an", "the", "said", and "at least one" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc. Moreover, the terms "first," "second," and "third," etc. in the claims are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

While the subject matter described and/or illustrated has been described in terms of various specific embodiments, those skilled in the art will recognize that the subject matter described and/or illustrated can be practiced with modification within the spirit and scope of the claims.

What is claimed is:

1. A fixture assembly for installing a guide pin to a substrate, said fixture assembly comprising:
   an elongate body extending a length along a longitudinal axis between a mounting end portion and a receiving end portion, the mounting end portion being configured to be mounted on a support member;
   a body opening extending into the body through the receiving end of the body and along the longitudinal axis, wherein the body opening is configured to receive at least a portion of the guide pin therein; and
   the guide pin comprising a guide portion received within the body opening, the guide pin comprising a mounting portion having a threaded opening configured to receive a threaded fastener for securing the guide pin to the substrate.

2. The fixture assembly according to claim 1, wherein the body opening comprises a size and a shape that is complementary with a size and a shape of the guide portion of the guide pin.

3. The fixture assembly according to claim 1, wherein the mounting portion of the guide pin is configured to be press-fit into a hole of the substrate.

4. The fixture assembly according to claim 1, wherein the mounting end portion comprises a mounting extension that is configured to be at least partially received within a mounting hole of the support member.

5. The fixture assembly according to claim 1, wherein the receiving end portion comprises an end surface through which the body opening extends, the end surface comprising a recess having a size and a shape that is approximately complementary with a size and a shape of a collar of the guide pin.

6. The fixture assembly according to claim 1, wherein the mounting end portion of the body comprises an alignment extension configured to orient the body relative to the support member.

7. The fixture assembly according to claim 1, wherein the body opening is a first body opening, the body further comprising a second body opening extending into the body through an exterior surface of the body and into communication with the first body opening, the second body opening comprising a threaded portion for receiving a set screw.

8. The fixture assembly according to claim 1, wherein the mounting portion of the guide pin is at least partially exposed for installation to the substrate.

9. The fixture assembly according to claim 1, wherein the guide portion of the guide pin is non-threaded.

10. The fixture assembly according to claim 1, wherein the guide portion of the guide pin comprises a flat extending along a length of the guide portion.

11. A fixture assembly for installing a guide pin to a substrate, said fixture assembly comprising:

an elongate body extending a length along a longitudinal axis between a mounting end portion and a receiving end portion, the mounting end portion being configured to be mounted on a support member;

a body opening extending into the body through the receiving end of the body and along the longitudinal axis, wherein the body opening is configured to receive at least a portion of the guide pin therein; and the guide pin comprising a guide portion and a mounting portion, the mounting portion having a threaded opening configured to receive a threaded fastener for securing the guide pin to the substrate, the body holding the guide portion of the guide pin during installation of the guide pin to the substrate, wherein the guide portion of the guide pin can be removed from the body opening while remaining installed to the substrate.

12. A fixture assembly comprising:

a support member having a mounting surface;

at least one fixture mounted on the support member for installing at least one guide pin to a substrate, said fixture comprising:

an elongate body extending a length along a longitudinal axis between a mounting end portion and a receiving end portion, the mounting end portion being mounted on the support member such that the body extends outwardly from the mounting surface of the support member; and a body opening extending into the body through the receiving end of the body and along the longitudinal axis, wherein the body opening is configured to receive at least a portion of the guide pin therein; and the guide pin comprising a guide portion received within the body opening, the guide pin comprising a mounting portion having a threaded opening configured to receive a threaded fastener for securing the guide pin to the substrate.

13. The fixture assembly according to claim 12, wherein the body opening comprises a size and a shape that is complementary with a size and a shape of the guide portion of the guide pin.

14. The fixture assembly according to claim 12, wherein the mounting portion of the guide pin is configured to be press-fit into a hole of the substrate.

15. The fixture assembly according to claim 12, wherein the support member comprises a mounting hole and the mounting end portion comprises a mounting extension that is at least partially received within the mounting hole.

16. The fixture assembly according to claim 12, wherein the receiving end portion comprises an end surface through which the body opening extends, the end surface comprising a recess having a size and a shape that is approximately complementary with a size and a shape of a collar of the guide pin.

17. The fixture assembly according to claim 12, wherein the support member comprises an alignment hole and the mounting end portion of the body comprises an alignment extension that is received within the alignment hole.

18. The fixture assembly according to claim 12, wherein the guide portion of the guide pin can be removed from the body opening while remaining installed to the substrate.

19. The fixture assembly according to claim 12, wherein the body opening is a first body opening, the fixture further comprising a second body opening extending into the body through an exterior surface of the body and into communication with the first body opening, the second body opening comprising a threaded portion for receiving a set screw.

20. The fixture assembly according to claim 12, wherein the guide portion of the guide pin is non-threaded.

* * * * *